(12) United States Patent
Song et al.

(10) Patent No.: US 11,737,219 B2
(45) Date of Patent: Aug. 22, 2023

(54) POWER ADAPTER

(71) Applicant: Delta Electronics (Shanghai) CO., LTD, Shanghai (CN)

(72) Inventors: Haibin Song, Shanghai (CN); Jian Zhou, Shanghai (CN); Daofei Xu, Shanghai (CN); Jinfa Zhang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 223 days.

(21) Appl. No.: 17/216,804

(22) Filed: Mar. 30, 2021

(65) Prior Publication Data

US 2021/0315112 A1 Oct. 7, 2021

(30) Foreign Application Priority Data

Apr. 3, 2020 (CN) .......................... 202020475156.6

(51) Int. Cl.
*H05K 5/00* (2006.01)
*H05K 1/18* (2006.01)
(Continued)

(52) U.S. Cl.
CPC .......... *H05K 5/0026* (2013.01); *H02M 7/003* (2013.01); *H05K 1/0216* (2013.01);
(Continued)

(58) Field of Classification Search
CPC ........ H05K 1/02; H05K 1/028; H05K 1/0216; H05K 1/14; H05K 1/141–144;
(Continued)

(56) References Cited

U.S. PATENT DOCUMENTS 4,847,742 A 7/1989 Ohashi et al.
5,400,239 A 3/1995 Caine
(Continued)

FOREIGN PATENT DOCUMENTS

CN 1582525 A 2/2005
CN 101548457 A 9/2009
(Continued)

OTHER PUBLICATIONS

The Extended European Search Report dated Aug. 27, 2021 for EP patent application No. 21163006.6.
(Continued)

*Primary Examiner* — Tuan T Dinh
(74) *Attorney, Agent, or Firm* — Qinghong Xu

(57) ABSTRACT

A power adapter includes a first output port, a second output port, a motherboard, a first flyback power module, a second flyback power module, a bus capacitor and an EMI module. The first flyback power module has a first circuit board and is electrically connected to the first output port. The second flyback power module has a second circuit board and is electrically connected to the second output port. The EMI module has a third circuit board and is arranged on the motherboard. The first circuit board and the second circuit board are arranged in parallel with each other, and are arranged substantially perpendicular to the motherboard on a first side of the motherboard.

15 Claims, 3 Drawing Sheets

(51) Int. Cl.
  *H05K 1/02*   (2006.01)
  *H02M 7/00*   (2006.01)
  *H05K 1/14*   (2006.01)

(52) U.S. Cl.
  CPC .............. *H05K 1/14* (2013.01); *H05K 1/181* (2013.01); *H05K 2201/1003* (2013.01)

(58) Field of Classification Search
  CPC .... H05K 1/18; H05K 1/181–187; H05K 5/00; H05K 5/0026; H02M 7/003; H02M 7/12; H02M 1/126
  USPC ................ 361/728, 784, 792–795, 803, 818; 363/44, 146–151
  See application file for complete search history.

(56) References Cited

U.S. PATENT DOCUMENTS

| | | | |
|---|---|---|---|
| 6,462,962 | B1 | 10/2002 | Cuk |
| 6,504,267 | B1 | 1/2003 | Giannopoulos |
| 6,549,432 | B1 | 4/2003 | Giannopoulos et al. |
| 6,552,917 | B1 | 4/2003 | Bourdillon |
| 6,813,163 | B2 * | 11/2004 | Inoue ................. H05K 1/144 361/784 |
| 7,092,259 | B2 | 8/2006 | Jacobs |
| 7,538,527 | B2 | 5/2009 | O'Driscoll et al. |
| 2003/0086279 | A1 | 5/2003 | Bourdillon |
| 2006/0181230 | A1 | 8/2006 | Hosotani et al. |
| 2008/0009145 | A1 * | 1/2008 | Zhou ................. H01R 13/6658 439/55 |
| 2008/0058028 | A1 * | 3/2008 | Nakayama ........... H02J 7/0042 455/573 |
| 2011/0018344 | A1 | 1/2011 | Liao et al. |
| 2013/0127248 | A1 | 5/2013 | Lai |
| 2013/0148388 | A1 | 6/2013 | Yang et al. |
| 2014/0347005 | A1 | 11/2014 | Zhou et al. |
| 2015/0015071 | A1 | 1/2015 | Deboy et al. |
| 2016/0359426 | A1 * | 12/2016 | Jitaru ................. H05K 3/366 |
| 2017/0047838 | A1 * | 2/2017 | Lin ................. H01R 24/68 |
| 2017/0331378 | A1 * | 11/2017 | Song ................. H02M 7/003 |
| 2018/0302981 | A1 * | 10/2018 | Ranganathan ......... H05K 1/142 |
| 2019/0068062 | A1 | 2/2019 | Chung et al. |
| 2020/0091758 | A1 | 3/2020 | Jahan et al. |

FOREIGN PATENT DOCUMENTS

| | | |
|---|---|---|
| CN | 102255481 A | 11/2011 |
| CN | 103051211 A | 4/2013 |
| CN | 103731031 A | 4/2014 |
| CN | 103812334 A | 5/2014 |
| CN | 104283444 A | 1/2015 |
| CN | 105099131 A | 11/2015 |
| CN | 205622488 U | 10/2016 |
| CN | 106385091 A | 2/2017 |
| CN | 107592021 A | 1/2018 |
| CN | 207427014 U | 5/2018 |
| CN | 109412389 A | 3/2019 |
| CN | 109474046 A | 3/2019 |
| CN | 208638049 U | 3/2019 |
| CN | 209088602 U | 7/2019 |
| CN | 209134305 U | 7/2019 |
| CN | 209963767 U | 1/2020 |
| JP | H07288976 A | 10/1995 |
| WO | 2016172684 A1 | 10/2016 |

OTHER PUBLICATIONS

The Extended European Search Report dated Jul. 27, 2021 for EP patent application No. 21166411.5.
Non-Final Rejection dated Mar. 31, 2022 of U.S. Appl. No. 17/212,056.
The First Office Action dated Apr. 26, 2022 of Chinese Patent No. 202010258177.7.
The First Office Action dated May 7, 2022 of Chinese Patent No. 202110292275.7.
The Non-Final Office Action dated Aug. 16, 2022 of U.S. Appl. No. 17/158,278.
Final Rejection dated Jan. 19, 2023 of U.S. Appl. No. 17/158,278.
2nd Office Action dated Jan. 28, 2023 of Chinese Application No. 202110292275.7.
3rd Office Action dated Apr. 15, 2023 of Chinese Application No. 202010258177.7.

* cited by examiner

POWER ADAPTER

CROSS REFERENCE

This application is based upon and claims priority to Chinese Patent Application No. 202020475156.6, filed on Apr. 3, 2020, the entire contents of which are incorporated herein by reference.

TECHNICAL FIELD

The present disclosure relates to the technical field of power electronics, and in particular to a power adapter.

BACKGROUND

Miniaturization and high power density have become a development trend of power adapters, and in order to meet the requirements of different electrical loads, power adapters with multiple output ports have been developed. It is a key issue to treat designs for a power adapter with only a single output port as a module so as to adopt a modular design concept and to quickly replicate such module for designing power adaptors with multiple output ports. In addition, the power adapter includes various components such as switching devices, filter inductors, and transformers. The transformer with voluminous magnetic components not only occupies a lot of space of the power adaptor but also generates severe heat. A layout of such components seriously affects the performance of the power adapter.

Further, in order to reduce the size of the power adapter, the switching frequency is developing towards high frequency. The power devices inside the power adapter work with high frequency state, which causes large electromagnetic interference and many problems in the system of the power adapter.

In summary, for designing a power adapter with multiple output ports, how to improve heat dissipation, reduce electromagnetic interference and achieve miniaturization and high power density are technical problems to be resolved urgently by those skilled in the art.

It should be noted that the information of the disclosure in the Background above is only used to enhance the understanding of the background of the present utility model, and therefore may include information that does not constitute the prior art known to those of ordinary skill in the art.

SUMMARY

According to the present disclosure, a power adapter includes a first output port, a second output port, a motherboard, a first flyback power module, a second flyback power module, a bus capacitor, and an EMI module. The first flyback power module has a first circuit board and the first flyback power module is electrically connected to the first output port. The second flyback power module has a second circuit board and the second flyback power module is electrically connected to the second output port. The bus capacitor and the EMI module with a third circuit board are arranged on the motherboard. The first circuit board and the second circuit board are arranged in parallel with each other, and the first circuit board and the second circuit board are arranged substantially perpendicular to the motherboard on a first side of the motherboard.

It is to be understood that both the foregoing general description and the following detailed description are exemplary and explanatory only and are not restrictive of the present disclosure.

BRIEF DESCRIPTION OF THE DRAWINGS

The drawings herein are incorporated into and constitute a part of this specification to show embodiments consistent with the present disclosure, and are used to explain the principles of the present disclosure together with the specification. Obviously, the drawings in the following description are only some embodiments of the present disclosure. For those of ordinary skill in the art, other drawings can be obtained based on these drawings without any creative effort.

DETAILED DESCRIPTION

Figure 1:
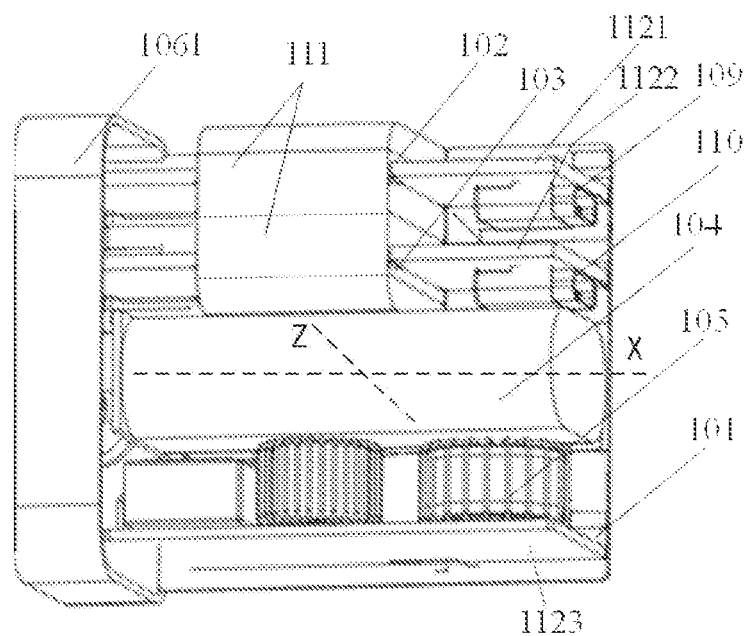
FIG. 1 depicts a front view of an internal 3-D structure of a power adapter according to an embodiment of the present disclosure.

Exemplary embodiments will now be described more fully with reference to the drawings. However, the exemplary embodiments can be implemented in various forms, and should not be construed as being limited to the examples set forth herein; rather, these embodiments are provided to make the present disclosure more comprehensive and complete, and fully convey the ideas of the exemplary embodiments to those skilled in the art. The same reference numerals in the drawings indicate the same or similar structures, and thus the detailed description thereof will be omitted.

Although relative terms are used in this specification, such as "upper" and "lower" to describe the relative relationship between one component and another component shown in the drawings, these terms are used in this specification only for convenience, for example, in the direction of the example or embodiment in the drawings. It can be understood that if the device shown is turned upside down, the component described as "upper" will become the "lower" component. When a structure is "on" another structure, it may indicate that the structure is integrally formed on the other structure, that the structure is "directly" provided on the other structure, or that the structure is provided on the other structure "indirectly" through another structure.

The terms "a", "an", "the", "said" and "at least one" are used to indicate the presence of one or more elements, components, etc.; the terms "includes", "including", "have" and "having" are used to indicate an inclusive meaning in an open sense and indicate that there may be additional elements, components, etc. in addition to the listed elements, components, etc.; the terms of "first", "second", "third", etc. are used merely as marks, but not as any limitation on the number of objects thereof.

In exemplary embodiments, a power adapter is provided which facilitates modular design, heat dissipation improvement and electromagnetic interference reduction.

Figure 2:
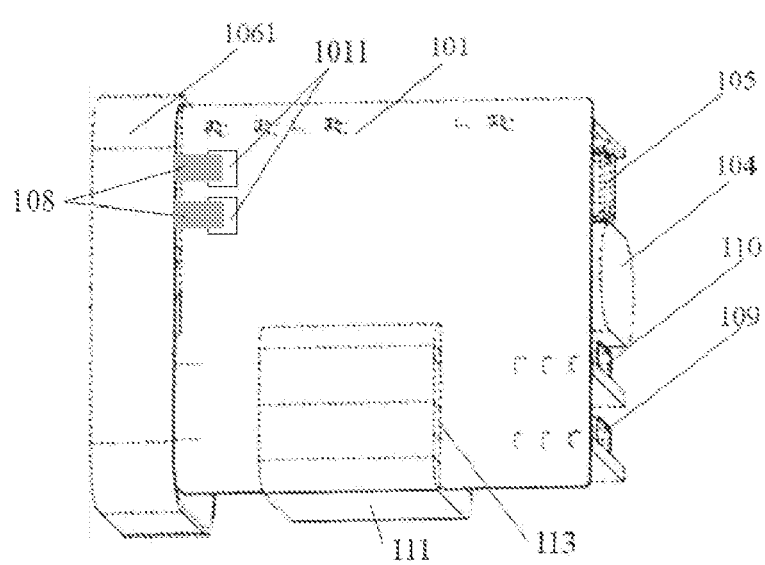
FIG. 2 shows a back view of an internal 3-D structure of a power adapter according to an embodiment of the present disclosure.

FIG. 1 depicts a front view of an internal 3-D structure of a power adapter according to an embodiment of the present disclosure. FIG. 2 shows a back view of an internal 3-D structure of a power adapter according to an embodiment of the present disclosure. As shown in FIGS. 1 and 2, a power adapter includes a first output port 109, a second output port 110, a motherboard 101, a first flyback power module 102, a second flyback power module 103, a bus capacitor 104 and an EMI module 105. The first flyback power module 102 has a first circuit board 1121 and is electrically connected to the first output port 109. The second flyback power module 103 has a second circuit board 1122 and is electrically connected to the second output port 110. The EMI module 105 has a third circuit board 1123 and is arranged on the motherboard 101. The first circuit board 1121 and the second circuit board 1122 are arranged in parallel with each other, and are arranged substantially perpendicular to the motherboard 101 on a first side of the motherboard 101.

The bus capacitor 104 is laid on the motherboard 101 and a longitudinal axis X of the bus capacitor 104 is arranged in perpendicular to a normal Z direction of the motherboard 101. The first circuit board 1121 and the second circuit board 1122 are arranged in parallel with each other, and the first circuit board 1121 and the second circuit board 1122 are vertically and electrically connected to the motherboard 101 and are arranged on a first side of the motherboard 101.

In some embodiments, the first output port 109 and the second output port 110 of the power adapter each includes a connector, which can be a USB port. The connector of the first output port 109 is arranged on the first circuit board 1121, and the connector of the second output port 110 is arranged on the second circuit board 1122.

Specifically, as shown in FIG. 1, the third circuit board 1123 is arranged substantially perpendicular to the motherboard 101 and is located on a second side of the motherboard 101. The longitudinal axis X of the bus capacitor 104 is arranged perpendicular to a normal direction of the third circuit board 1123, and is located between the second flyback power module 103 and the EMI module 105. In the embodiment, the flyback power modules 102 and 103 and the EMI module 105 are located on opposite sides of the motherboard 101, respectively. The flyback power modules 102 and 103 and the EMI module 105 are components with the ability to generate large heat, and a dispersed arrangement of the flyback power modules 102 and 103 and the EMI module 105 is helpful for dissipating the generated heat, in additional, such design is also helpful to reduce electromagnetic interference.

In some other embodiments, the bus capacitor 104 may also be located on the second side of the motherboard 101, that is, the EMI module 105 is located between the bus capacitor 104 and the flyback power modules 102 and 103, and the present disclosure is not limited thereto.

Herein, the quantity of the flyback power modules is not limited to two and can also be more than two. In another embodiment, the power adaptor may include the first flyback power module 102 with the first circuit board 1121, the second flyback power module 103 with the second circuit board 1122, and additional flyback power module(s) each with a fourth circuit board. The first circuit board 1121, the second circuit board 1122, and the fourth circuit board(s) are arranged in parallel with each other. The first circuit board 1121, the second circuit board 1122, and the fourth circuit board(s) are vertically and electrically connected to the motherboard 101 and are arranged on a first side of the motherboard 101. In other word, the normal directions of these circuit boards are in parallel. Moreover, the normal direction of each of the circuit board is in perpendicular to the normal Z direction of the motherboard 101. Further, each of the flyback power modules is provided with a corresponding output port.

In the embodiments of the present disclosure, each of the first flyback power module 102 and the second flyback power module 103 includes a primary switch (not shown), a transformer, and a secondary switch (not shown). The primary switch, the transformer and the secondary switch are all assembled on the first circuit board 1121. The transformer includes a magnetic core, a primary winding and a secondary winding. The primary switch is electrically coupled between an input power source and the primary winding. The secondary switch is electrically coupled between the secondary winding and the corresponding output port. The magnetic core of the corresponding transformers can be independent of each other or be integrated together. As shown in FIG. 1, the first flyback power module 102 has a first transformer and the second flyback power module 103 has a second transformer. Each of the first transformer and the second transformer may have an independent magnetic core 111 adjacent to each other. Further, the first flyback power module 102 and the second flyback power module 103 each have a circuit board and each of the first circuit board 1121 and the second circuit board 1122 can be assembled to pass through a window of the corresponding magnetic core 111 respectively. In some other embodiments, the first circuit board 1121 may have one or more openings, and at least one or more magnetic legs of the magnetic core 111 are assembled to pass through the respective openings to form the transformer. In some embodiments, the windings of the transformer can also be buried into the first circuit board 1121. The second flyback power module 103 has the similar design with the first flyback power module 102 in circuit board as well as the magnetic cores 111. The detailed description is omitted for the sake of brevity.

In yet another embodiment, an opening 113 can be provided on the motherboard 101. As shown in FIG. 2, part of the magnetic cores 111 can be assembled to sink into the opening 113, which can also reduce the size of the power adapter and increase the power density of the power adapter.

In practical applications, the magnetic cores 111 of the transformers of the first flyback power module 102 and the second flyback power module 103 can also be integrated together. Similarly, the circuit boards 1121 and 1122 can be assembled to pass through corresponding windows of the integrated magnetic cores 111 to form the transformer. In some other embodiments, the circuit boards may have one or more openings, and at least one or more magnetic legs of the magnetic cores 111 can be assembled to pass through the openings to form the transformers. The integrated magnetic cores 111 can reduce not only the volume but also the power loss of the flyback power modules, thereby reducing the size of the power adapter and increasing the power density of the power adapter.

In the embodiments of the present disclosure, as shown in FIG. 1, the bus capacitor 104 can be laid in parallel with the motherboard 101. Since the volume of the bus capacitor 104 is relatively large, with such arrangement, the size in a height direction of the power adapter can be further reduced. In addition, the first flyback power module 102 and the second flyback power module 103 and the bus capacitor 104 are all arranged in parallel on the motherboard 101, and the first flyback power module 102 and the second flyback power module 103 are electrically connected in parallel to the bus capacitor 104 through the motherboard 101.

In an embodiment, output voltages and output powers of the first output port 109 and the second output port 110 are adjustable by controlling the corresponding flyback power modules 102 and 103 of the power adapter. In some other embodiments, maximum output powers of the first output port 109 and the second output port 110 of the power adapter may be the same or can be different.

The quantity of output ports of the power adapter is not limited to two, that is, the ports of the power adapter may include other output port(s) in addition to the first output port 109 and the second output port 110. In some embodiments, the output voltage of each output port or the output voltages of part of the output ports can be adjusted. In some embodiments, the output power of each output port or the output powers of part of the output ports can be adjusted. And the maximum output powers adjusted of the output ports can be the same or different.

Figure 3:
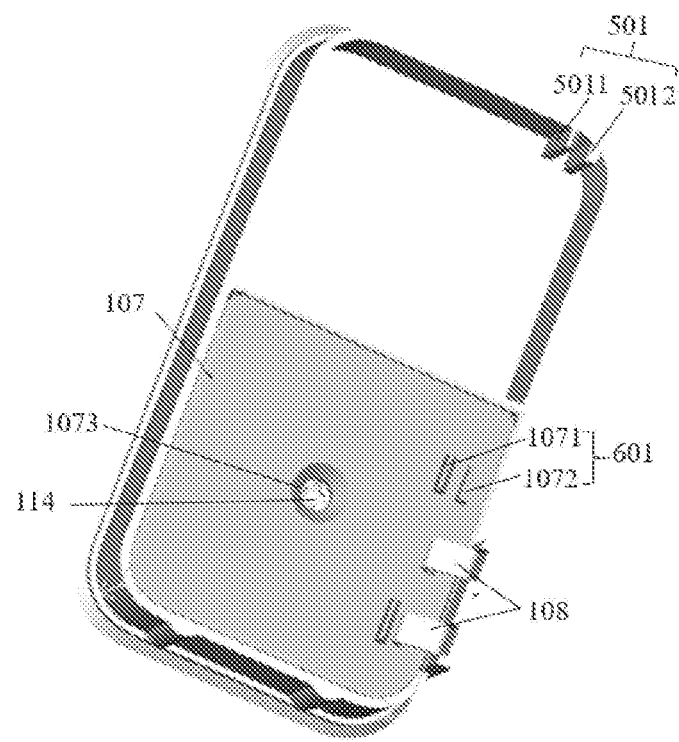
FIG. 3 is a schematic diagram showing a structure of a first housing according to an embodiment of the present disclosure.

As shown in FIG. 1 and FIG. 3, the power adapter further includes a first housing 1061 with a snap-fit structure, and the motherboard 101 is detachably assembled to the first housing 1061 by being snap-fit into the snap-fit structure. As shown in FIG. 3, the snap-fit structure includes a first snap slot 501. And a first protrusion part 5011 and a second protrusion part 5012 are located on a sidewall of the first housing 1061 to form the first snap slot 501. The motherboard 101 is assembled into the first snap slot 501.

The first housing 1061 is provided with two conductive shrapnel elements 108, the motherboard 101 is further provided with two conductive parts 1011, and the conductive shrapnel elements 108 are directly and electrically in contact with corresponding conductive parts 1011 respectively. The conductive parts 1011 can be a golden finger, and the conductive shrapnel elements 108 are in contact with the golden finger electrically.

Figure 6:
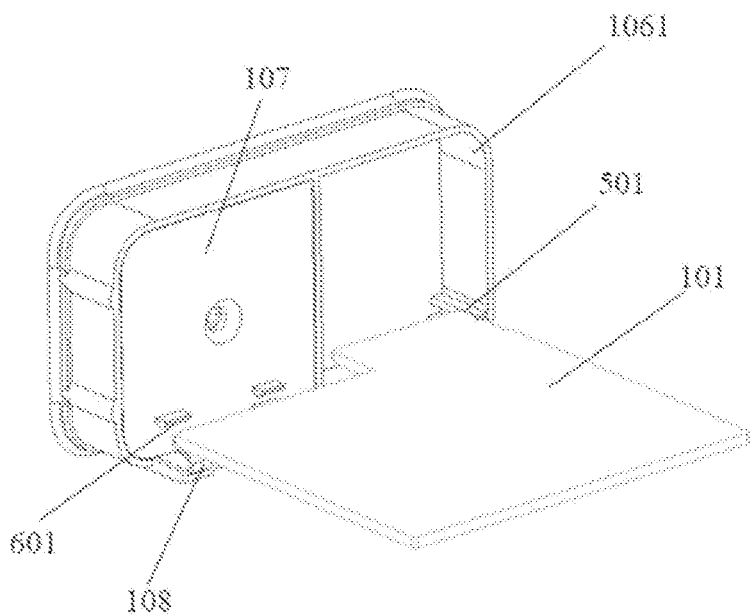
FIG. 6 is a schematic diagram of connection between a first housing shown in FIG. 3 and a motherboard according to an embodiment of the present disclosure.

Please refer to FIG. 3 and FIG. 6. FIG. 3 is a schematic diagram showing a structure of a first housing 1061 according to an embodiment of the present disclosure. FIG. 6 is a schematic diagram of connection between a first housing 1061 shown in FIG. 3 and a motherboard 101 according to an embodiment of the present disclosure. As shown in FIG. 3, the first housing 1061 further includes a shielding plate 107. The shielding plate 107 is assembled to the first housing 1061 and is provided with a second snap slot 601. The motherboard 101 can be snap-fit and detachably assembled into the second snap slot 601. Specifically, the shielding plate 107 includes a third protrusion part 1071 and a fourth protrusion part 1072 to form the second snap slot 601. And the motherboard 101 is assembled into the second snap slot 601, as shown in FIG. 6. The shielding plate 107 shown in FIG. 3 & FIG. 6 is provided with two second snap slots, but in practical applications, the quantity of the second snap slots is not limited.

Figure 4:
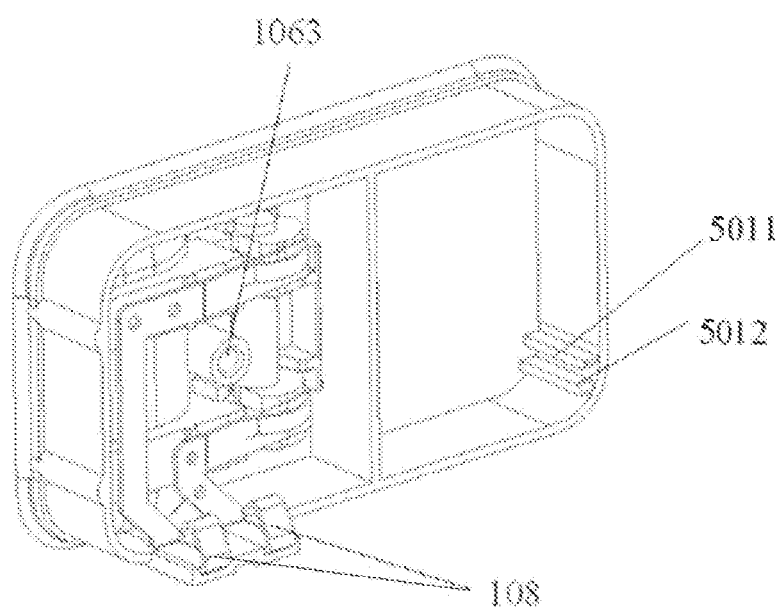
FIG. 4 is a schematic diagram of a first housing according to an embodiment of the present disclosure.

FIG. 4 is a schematic diagram of the first housing 1061 according to an embodiment of the present disclosure. As shown in FIG. 4, a mounting hole 1063 is provided on the first housing 1061 for assembling with the shielding plate 107. As shown in FIG. 3 to FIG. 4, a through hole 1073 is provided on the shielding plate 107 corresponding to the mounting hole 1063. A mounting member 114 is inserted into the mounting hole 1063 via the through hole 1073 and is assembled with the mounting hole 1063. The mounting member 114 may be, for example, a bolt, a screw, or the like.

As shown in FIG. 3, the shielding plate 107 then is detachably assembled with the first housing 1061 through mounting member 114.

Figure 5:
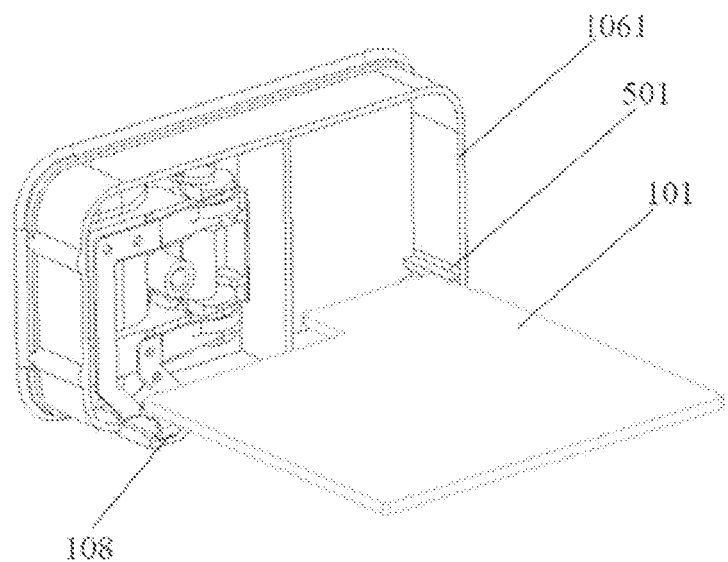
FIG. 5 is a schematic diagram illustrating the electrically connection between the first housing and the motherboard.

Please refer to FIG. 5 and FIG. 6. FIG. 5 is a schematic diagram illustrating the electrically connection between the first housing 1061 and the motherboard 101. The shielding plate 107 is not shown in FIG. 5 for the sake of clarity so as to demonstrate the electrically connection between the first housing 1061 and the mother board 101. As shown in FIG. 5 & FIG. 6, the motherboard 101 is assembled into the first snap slot 501 and the second snap slot 601. The shape of the motherboard 101 is not a perfect square. In this embodiment, it looks like an L-shape. In other word, a corner of a hypothetical square-shape motherboard 101 has been trimmed so that the trimmed portion can be fitted into the first housing 1061 for accommodating with certain structure (e.g. the shrapnel elements 108) in the first housing 1061. After assembling the motherboard 101 with the first housing 1061, the golden finger (not shown) on the bottom surface of the motherboard 101 is electrically connected to the conductive shrapnel elements 108. Wherein, the components on the motherboard 101 are omitted and are not shown in the figures for the sake of brevity.

In some embodiments, the power adapter further has a second housing (not shown) which is detachably assembled with the first housing 1061. A space defined by the first housing 1061 and the second housing is used to accommodate the motherboard 101, the first flyback power module 102, the second flyback module 103, the bus capacitor 104, the EMI module 105 and the connectors. The connectors are arranged to be exposed externally through the second housing in the direction opposite to the first housing 1061.

According to the embodiments of the disclosure of the power adapter, by arranging the flyback power modules in parallel on one side of the motherboard, it is convenient for extension and facilitates the modular design. By arranging the flyback power modules and the EMI module on the respective sides of the motherboard and placing the bus capacitor in between the flyback power modules and the EMI module, the heat generated by the flyback power modules and the EMI module is easy to dissipate. Further, since the two biggest heat sources, e.g. the flyback power modules and the EMI module, are set apart in terms of the mother board, which can facilitate the heat dissipation of the power adapter and greatly reduce the electromagnetic interference of the power adapter. Moreover, the snap-fit connection between the motherboard and the housing makes the assembly simple and reliable.

Other embodiments of the present disclosure will be apparent to those skilled in the art in consideration of the specification and practice of the present disclosure disclosed herein. The present application is intended to cover any variations, uses, or adaptations of the present disclosure, which follow the general principles of the present disclosure and include common general knowledge or conventional technical measures in the art that are not disclosed in the present disclosure. The specification and embodiments are merely illustrative, and a true scope and spirit of the present disclosure is defined by the appended claims.

What is claimed is:
1. A power adapter comprising:
a first output port and a second output port;
a motherboard;
a first flyback power module with a first circuit board, wherein the first flyback power module is electrically connected to the first output port;

a second flyback power module with a second circuit board, wherein the second flyback power module is electrically connected to the second output port; and a bus capacitor and an EMI module with a third circuit board which are arranged on the motherboard;

wherein the first circuit board and the second circuit board are arranged in parallel with each other, and the first circuit board and the second circuit board are arranged substantially perpendicular to the motherboard on a first side of the motherboard, and wherein the first flyback power module has a first transformer, the second flyback power module has a second transformer, and the first transformer and the second transformer share an integrated transformer core.

2. The power adapter according to claim 1, wherein the third circuit board is arranged substantially perpendicular to the motherboard on a second side of the motherboard, and the bus capacitor is arranged between the second flyback power module and the EMI module.

3. The power adapter according to claim 1, wherein the first flyback power module has a first transformer and the first transformer has an independent magnetic core.

4. The power adapter according to claim 1, wherein an opening is provided on the motherboard, and part of the integrated transformer is sunk into the opening.

5. The power adapter according to claim 1, wherein the bus capacitor is laid on the motherboard and a longitudinal axis of the bus capacitor is arranged in perpendicular to a normal direction of the motherboard.

6. The power adapter according to claim 1, further comprising a first housing with a snap-fit structure, and the motherboard is detachably assembled into the first housing.

7. The power adapter according to claim 1, wherein the first flyback power module and/or the second flyback power module shares the bus capacitor through the motherboard.

8. The power adapter according to claim 1, wherein an output voltage and an output power of each of the first output port and the second output port of the power adapter are adjustable.

9. The power adapter according to claim 3, wherein an opening is provided on the motherboard, and a part of the magnetic core is sunk into the opening.

10. The power adapter according to claim 6, wherein the first housing is provided with a conductive shrapnel element, the motherboard is further provided with a conductive part, and the motherboard is assembled to let the conductive part to be in contact with the conductive shrapnel element electrically.

11. The power adapter according to claim 6, wherein the snap-fit structure comprises a first protrusion part and a second protrusion part located on a sidewall of the first housing to form a first snap slot, and the motherboard is assembled to the first snap slot.

12. The power adapter according to claim 6, wherein each of the first output port and the second output port comprises a connector.

13. The power adapter according to claim 10, wherein the conductive part is a golden finger, and the conductive shrapnel element is in contact with the golden finger electrically.

14. The power adapter according to claim 10, further comprising a shielding plate, wherein the shielding plate is assembled to the first housing and provided with a second snap slot, and the motherboard is snap-fit and detachably connected to the second snap slot.

15. The power adapter according to claim 12, further comprising a second housing detachably connected to the first housing;

wherein a space defined by the first housing and the second housing is used to accommodate the motherboard, the first flyback power module, the second flyback module, the bus capacitor, the EMI module and the connectors, and wherein the connectors are arranged to be exposed externally through the second housing in the direction opposite to the first housing.

\* \* \* \* \*